United States Patent
Degura

(10) Patent No.: US 11,197,400 B2
(45) Date of Patent: Dec. 7, 2021

(54) BENDING APPARATUS

(71) Applicant: FUJI CORPORATION, Chiryu (JP)

(72) Inventor: Kazuya Degura, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 544 days.

(21) Appl. No.: 15/773,320

(22) PCT Filed: Nov. 9, 2015

(86) PCT No.: PCT/JP2015/081467
§ 371 (c)(1),
(2) Date: May 3, 2018

(87) PCT Pub. No.: WO2017/081724
PCT Pub. Date: May 18, 2017

(65) Prior Publication Data
US 2018/0324990 A1 Nov. 8, 2018

(51) Int. Cl.
*H05K 13/04* (2006.01)

(52) U.S. Cl.
CPC ......... *H05K 13/0473* (2013.01); *H05K 13/04* (2013.01)

(58) Field of Classification Search
CPC .. H05K 13/04; H05K 13/0473; H05K 13/023; G02F 1/133305; G09F 9/00; G09F 9/301; Y10T 83/6606; Y10T 29/515
See application file for complete search history.

(56) References Cited

U.S. PATENT DOCUMENTS

| | | | | |
|---|---|---|---|---|
| 3,414,024 A | * | 12/1968 | Anderson | H05K 13/0473 140/1 |
| 4,447,945 A | * | 5/1984 | Priscsak | H05K 13/0473 140/105 |
| 6,609,295 B1 | | 8/2003 | Koyama et al. | |
| 9,949,420 B2 | * | 4/2018 | Asao | H05K 13/0473 |

(Continued)

FOREIGN PATENT DOCUMENTS

| | | |
|---|---|---|
| JP | 2-621 00 A | 3/1990 |
| JP | 7-1 54098 A | 6/1995 |

(Continued)

OTHER PUBLICATIONS

International Search Report dated Jan. 26, 2016 in PCT/JP2015/081467 filed Nov. 9, 2015.

*Primary Examiner* — Minh N Trinh
(74) *Attorney, Agent, or Firm* — Oblon, McClelland, Maier & Neustadt, L.L.P.

(57) ABSTRACT

A cut and clinch unit is provided with pair of slide bodies, and each slide body is configured from movable section and fixed section that slidably holds the movable section. An insertion hole is formed in the movable section. A pair of leads of a leaded component are inserted into the insertion holes of a pair of slide bodies, and the pair of leads are bent into an N shape by each movable section being slid. The cut and clinch unit is movable in the XY directions by operation of a moving device. Also, the distance between the pair of slide bodies can be changed freely. Accordingly, it is possible to mount leads at any position on a board in a state bent into an N shape, and to mount leaded components with various different lead separation distances on a board in a state bent into an N shape.

4 Claims, 14 Drawing Sheets

(56) References Cited

U.S. PATENT DOCUMENTS

| | | | |
|---|---|---|---|
| 10,206,318 B2* | 2/2019 | Matsumoto | H05K 13/043 |
| 10,375,869 B2* | 8/2019 | Nakanishi | H05K 13/0015 |
| 10,617,013 B2* | 4/2020 | Ishikawa | H05K 13/0408 |
| 2006/0164794 A1* | 7/2006 | Kadota | H05K 13/0413 |
| | | | 361/600 |

FOREIGN PATENT DOCUMENTS

| | | |
|---|---|---|
| JP | 2001-015999 A | 1/2001 |
| JP | WO2015/063827 A1 * | 5/2015 |

* cited by examiner

BENDING APPARATUS

TECHNICAL FIELD

The present application relates to a bending device for bending a lead when mounting a leaded component on a board.

BACKGROUND ART

When mounting a leaded component on a board, as disclosed in the patent literature below, leads are inserted into through-holes formed in the board, and the leads are bent by a bending device.

Patent literature 1: JP-A-H2-62100

BRIEF SUMMARY

Technical Problem

With a bending device of the above patent literature, by bending a pair of leads in a different direction to the direction in which the pair of leads are lined up so as to separate the leads, a leaded component is inserted into a board in a state with the pair of leads bent roughly into a N shape (hereinafter also referred to as "N-bent state"). However, in the above patent literature, although mounting a leaded component at a specified position on a board in an N-bent state is disclosed, a convenient way to mount the leaded component at various positions on the board is not disclosed, thus it is desirable to improve the convenience of a bending device. The present disclosure takes account of such circumstances, and an object thereof is to improve the convenience of a bending device.

Solution to Problem

To solve the above problems, a bending device of the present disclosure includes: a bending unit including a pair of bending bodies each having a slide section in which is formed an insertion hole configured to have a lead of a leaded component inserted therein, and a holding section configured to slidably hold the slide section, the bending unit being configured to bend a pair of leads inserted into the insertion holes of the pair of bending bodies in a different direction to a direction in which the pair of leads are lined up by the sliding section being slid; and a moving device configured to move the bending unit in a direction perpendicular to an insertion direction of the leads into the insertion holes.

Advantageous Effects

With a bending device of the present disclosure, the bending unit that bends the pair of leads in an N-bent state is movable by a moving device in a direction perpendicular to the insertion direction of the leads into the insertion holes. Accordingly, it is possible to mount leads in an N-bent state at any position of a board, thus improving the convenience of a bending device.

DESCRIPTION OF PREFERRED EMBODIMENTS

The following describes in detail referring to the figures an example embodiment of the present disclosure.

Configuration of Component Mounter

Figure 1:
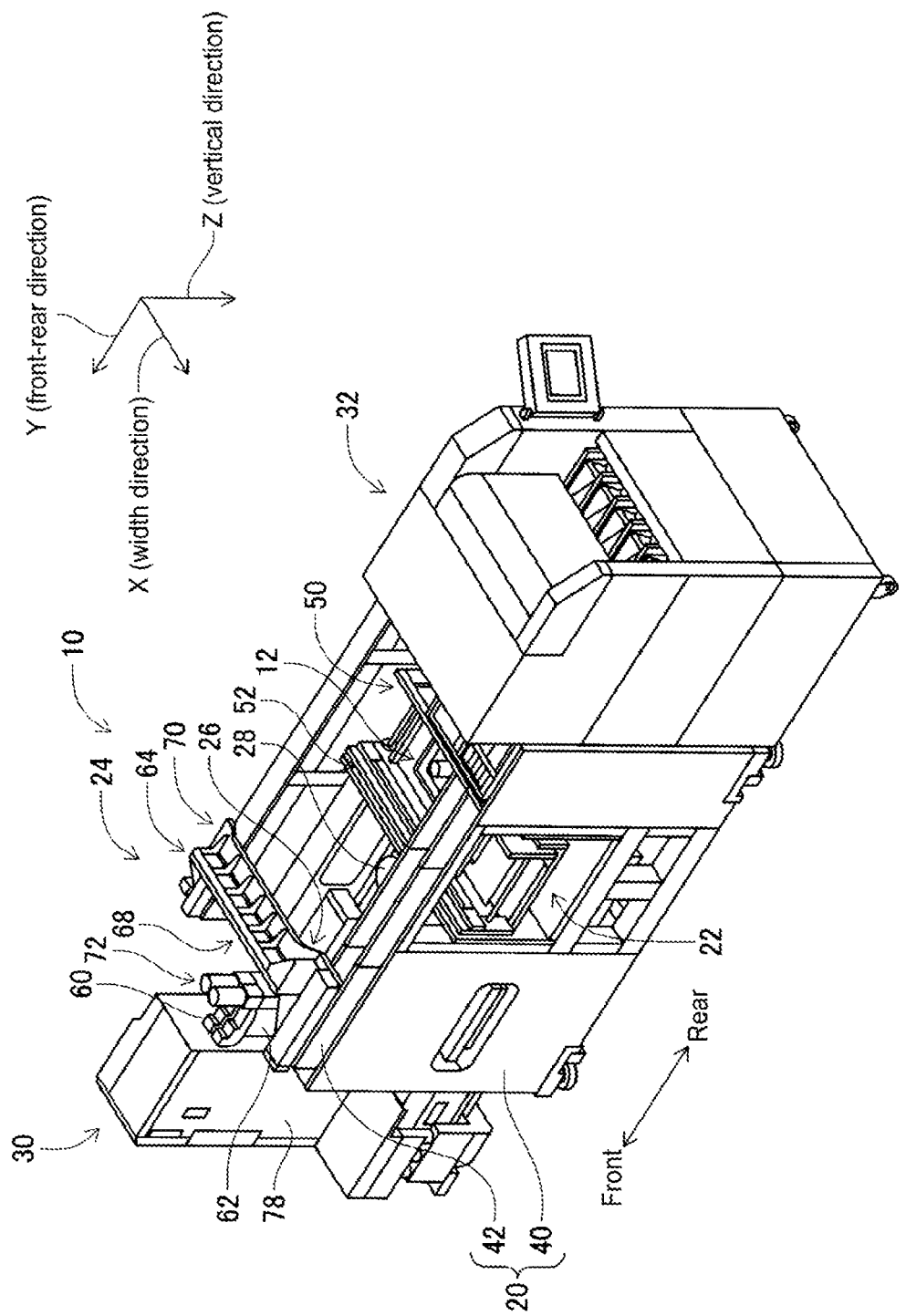
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, cut and clinch device (refer to FIG. 3) 34, and control device (refer to FIG. 11) 36. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the direction perpendicular to the X direction and the Y direction is referred to as the Z direction. That is, the width direction of component mounter 10 is the X direction, the front-rear direction is the Y direction, and the vertical direction is the Z direction.

Figure 2:
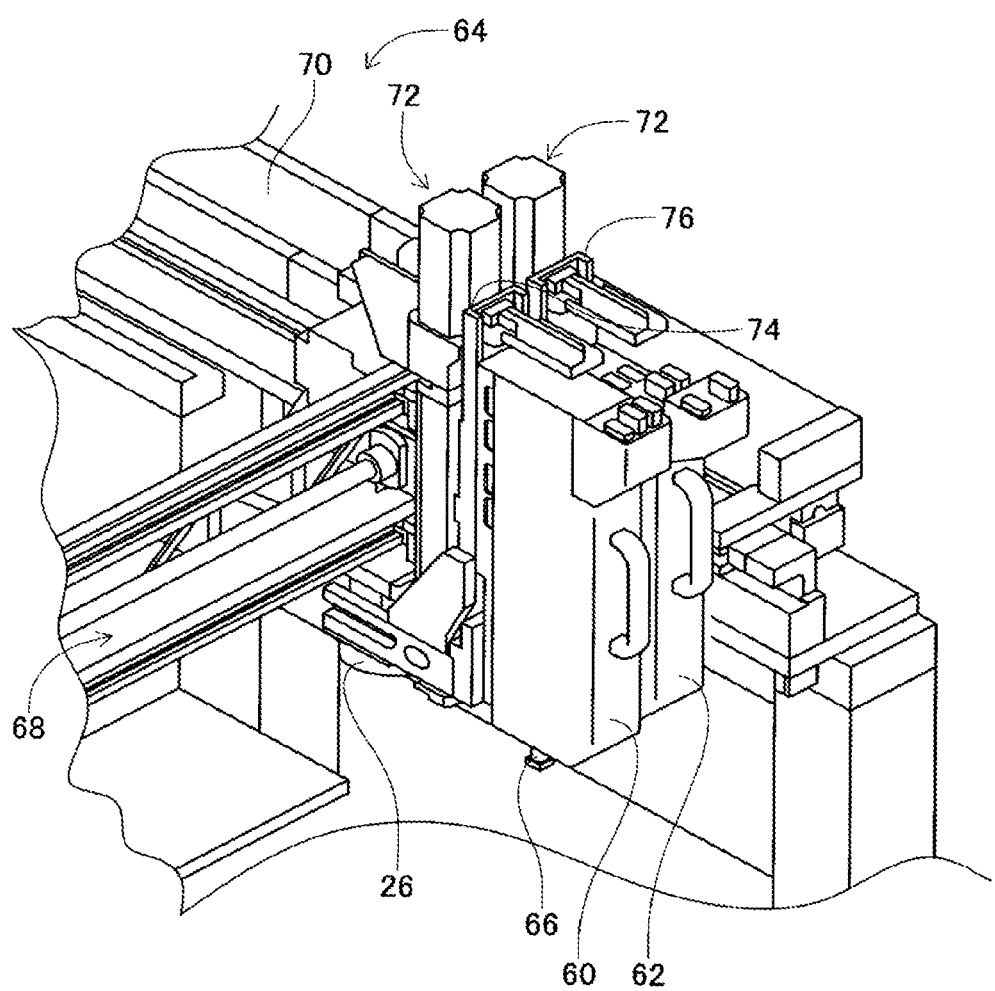
FIG. 2 is a perspective view of a component mounting device.

Component mounting device 24 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 11) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation.

Note that, components supplied by component supply device 30 and loose component supply device 32 may include electronic circuit components, configuration components of solar panels, configuration components of power modules, and the like. Also, electronic circuit components include components with leads and components without leads.

Figure 3:
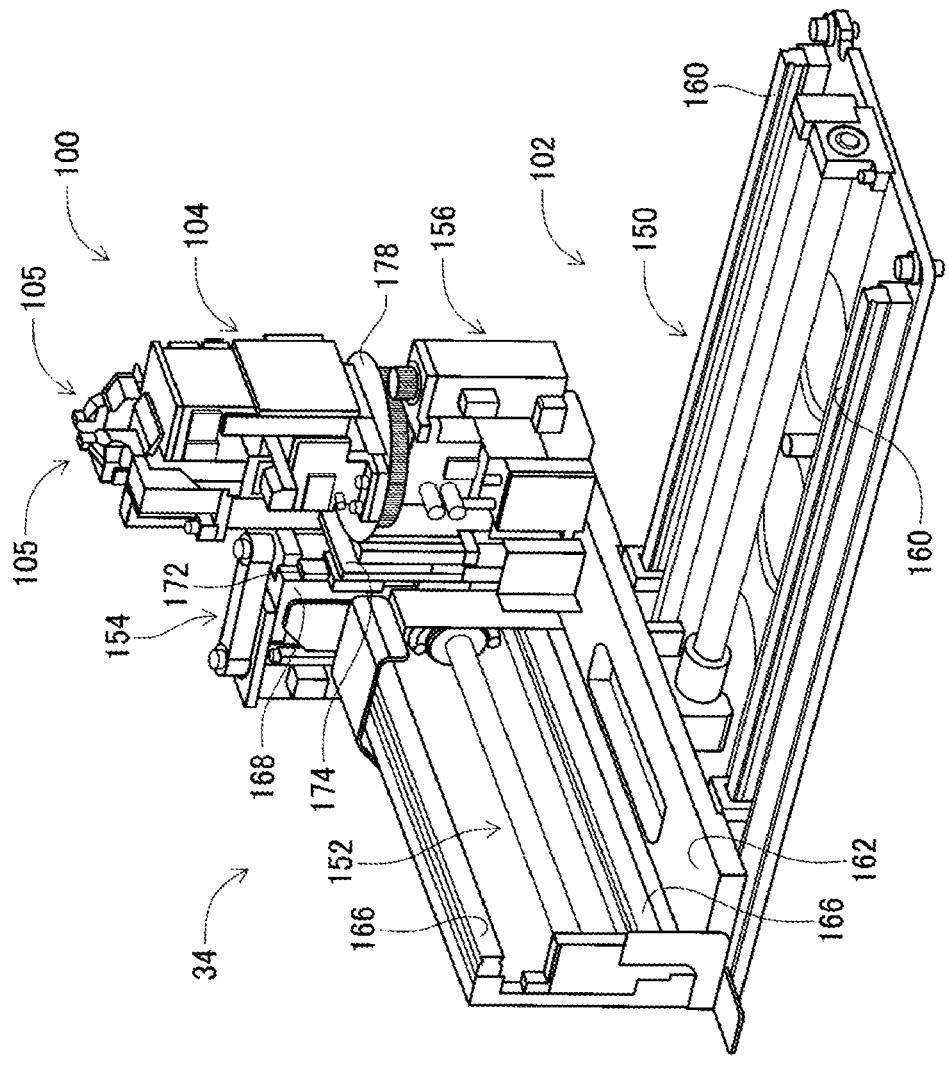
FIG. 3 is a perspective view of a cut and clinch device.
Figure 4:
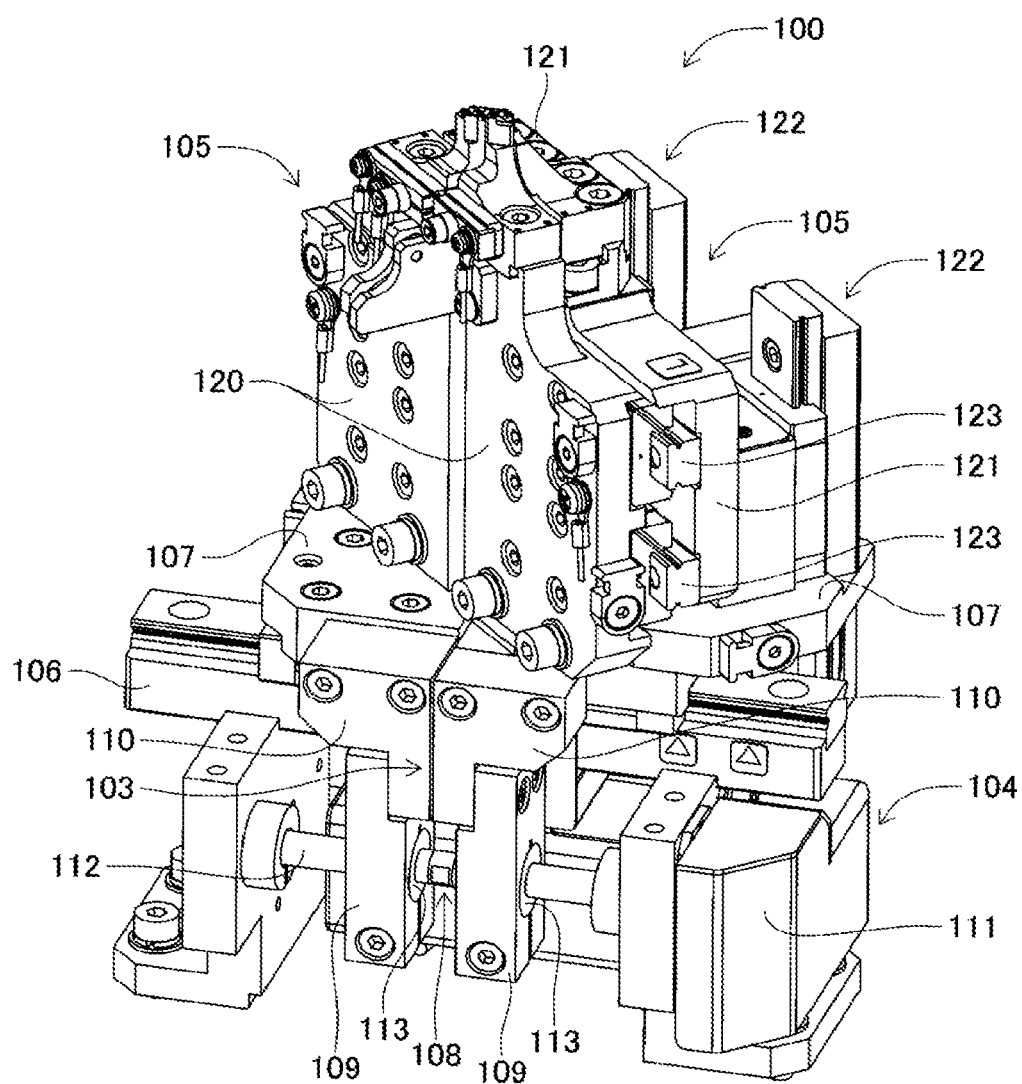
FIG. 4 is a perspective view of a cut and clinch unit from the front side.
Figure 4:
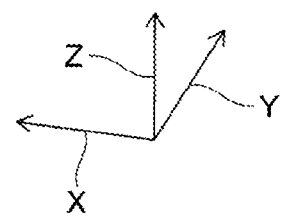
Figure 5:
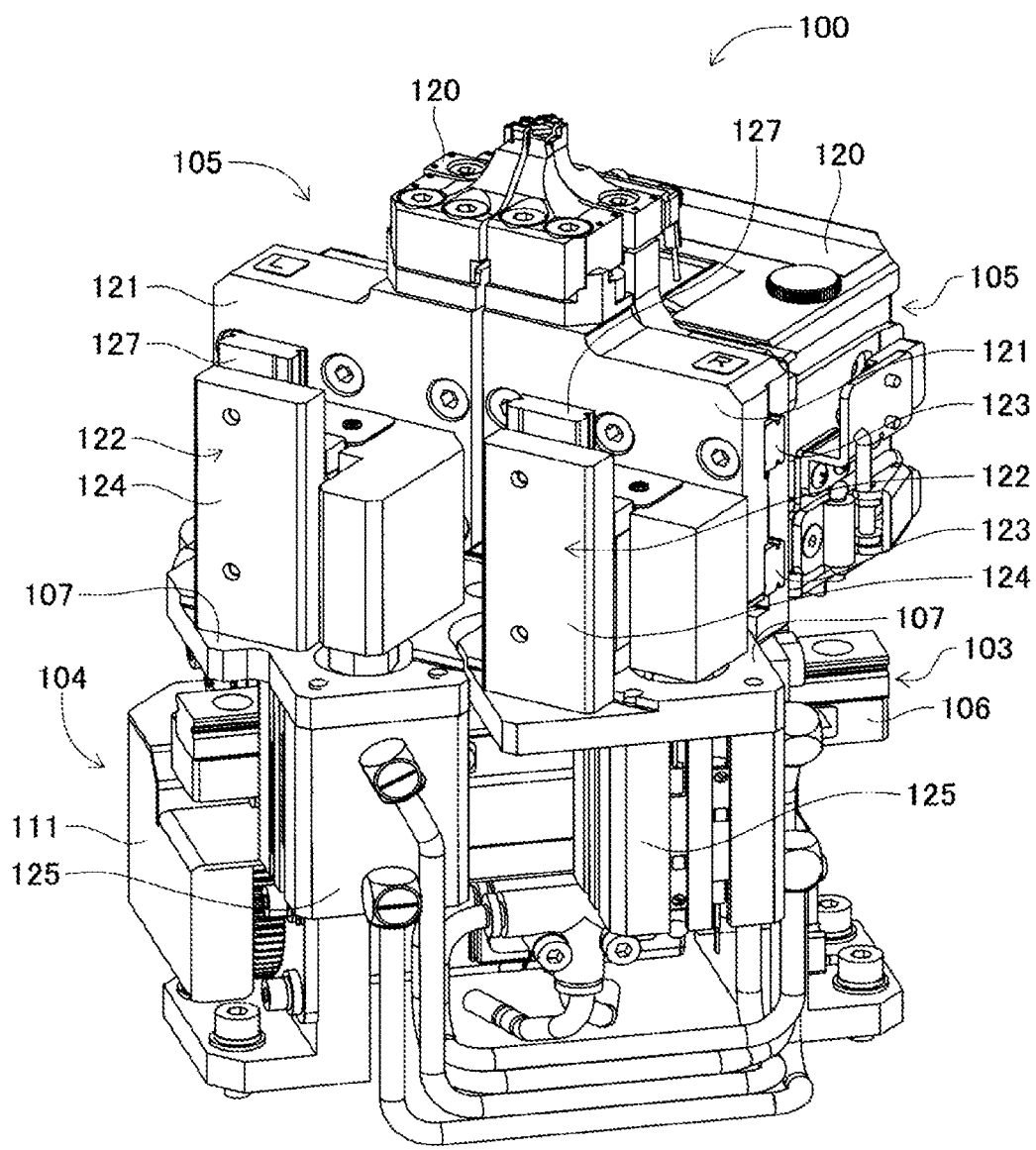
FIG. 5 is a perspective view of the cut and clinch unit from the rear side.

Cut and clinch device 34 is arranged below conveyance device 50 and, as shown in FIG. 3, includes cut and clinch unit 100 and unit moving device 102. As shown in FIGS. 4 and 5, cut and clinch unit 100 includes pitch changing mechanism 103, unit main body 104, and pair of slide bodies 105. Note that, FIG. 4 is a perspective view of cut and clinch unit 100 from the front side, and FIG. 5 is a perspective view of cut and clinch unit 100 from the rear side.

Pitch changing mechanism 103 includes slide rail 106, pair of stages 107, ball screw mechanism 108, pair of slide blocks 109, pair of connecting blocks 110, and electromagnetic motor 111. Slide rail 106 is provided on an upper end of unit main body 104 extending in the X direction. The pair of stages 107 are slidably supported by slide rail 106. Ball screw mechanism 108 includes screw rod 112 and pair of nuts 113. Screw rod 112 is provided below slide rail 106 extending in the X direction.

A first male screw (not shown) is formed on the outer circumferential surface of screw rod 112 from a center portion towards an end, and a second male screw (not shown) that goes in the opposite direction to the first male screw is formed from the center portion to the other end. One of the pair of nuts 113 is engaged on the first male screw, and the other of the pair of nuts 113 is engaged on the second male screw. Also, a through-hole is formed in each of the pair of slide blocks 109, and a nut 113 is engaged in the through-holes. Screw rod 112 is rotated on its own axis by the driving of electromagnetic motor 111. Accordingly, by the driving of electromagnetic motor 111, the pair of nuts 113 engaged on screw rod 112 slide together with the pair of slide blocks 109 so as to move towards or away from each other.

Also, one of the pair of slide blocks 109 is connected to one of the pair of stages 107 via one of the pair of connecting blocks 110, and the other of the pair of slide blocks 109 is connected to the other of the pair of stages 107 via the other of the pair of connecting blocks 110. According to such a configuration, by the driving of electromagnetic motor 111, the pair of stages 107 slides towards or away from each other such that the distance between the pair of stages 107 is controllable.

Also, each of the pair of slide bodies 105 includes fixed section 120, movable section 121, and slide device 122, with one of the pair of slide bodies 105 being arranged on an upper surface of one of the pair of stages 107, and the other of the pair of slide bodies 105 being arranged on an upper surface of the other of the pair of stages 107. In detail, fixed section 120 of each slide body 105 is fixed to an upper surface of stage 107 in a state rotated substantially 45 degrees in an XY plane with respect to the direction in which slide rail 106 extends. Also, two slide rails 123 are fixed to the rear side of fixed section 120. Note that, the angle between the direction in which slide rail 123 extends and the direction in which slide rail 106 extends is approximately 45 degrees in the XY plane. Further, movable section 121 is slidably supported by the two slide rails 123. By this, movable section 121 slides with respect to fixed section 120 in a direction perpendicular to a direction substantially 45 degrees to the direction in which slide rail 106 extends in the XY plane.

Figure 6:
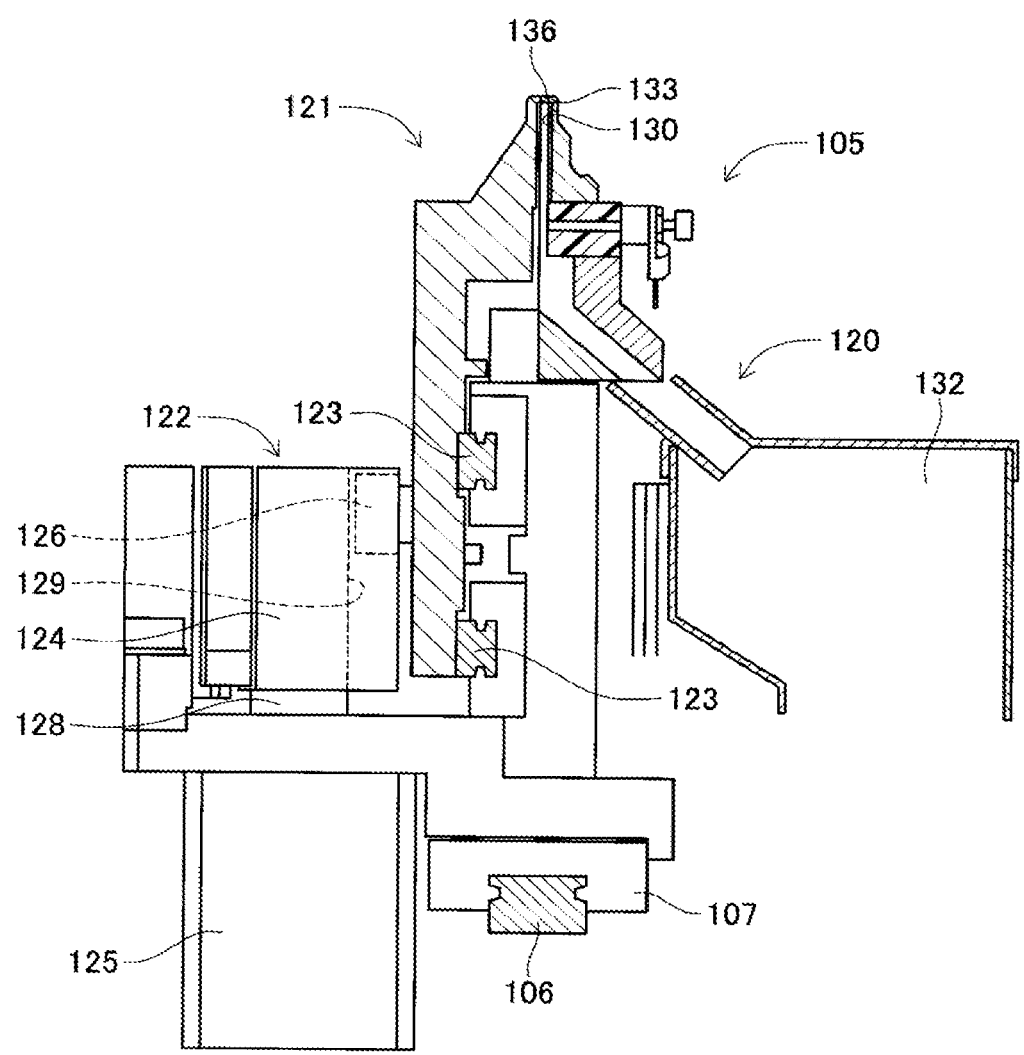
FIG. 6 is a cross section of a slide body.

Also, as shown in FIG. 6, slide device 122 includes slide block 124, cylinder 125, and roller 126. Slide block 124 is slidably supported by slide rail (refer to FIG. 5) 127 arranged on the rear side of movable section 121 extending in the vertical direction. Cylinder 125 is arranged below slide block 124 extending in the vertical direction, and cylinder rod 128 of cylinder 125 is connected to slide block 124. Accordingly, slide block 124 slides vertically due to the driving of cylinder 125.

Figure 7:
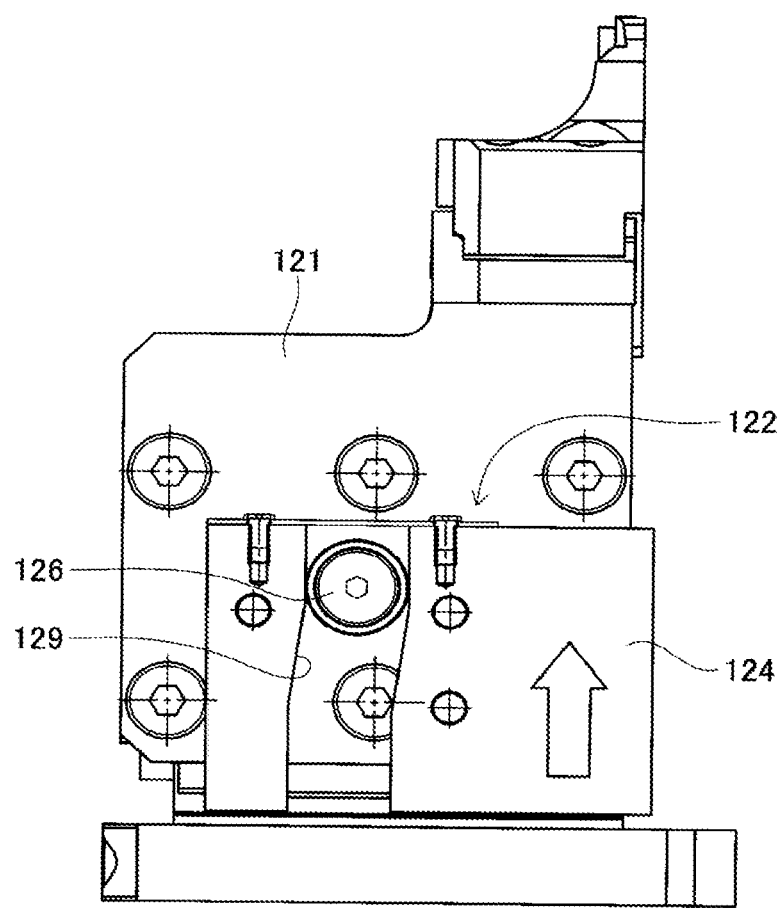
FIG. 7 illustrates operation of a moving section.
Figure 8:
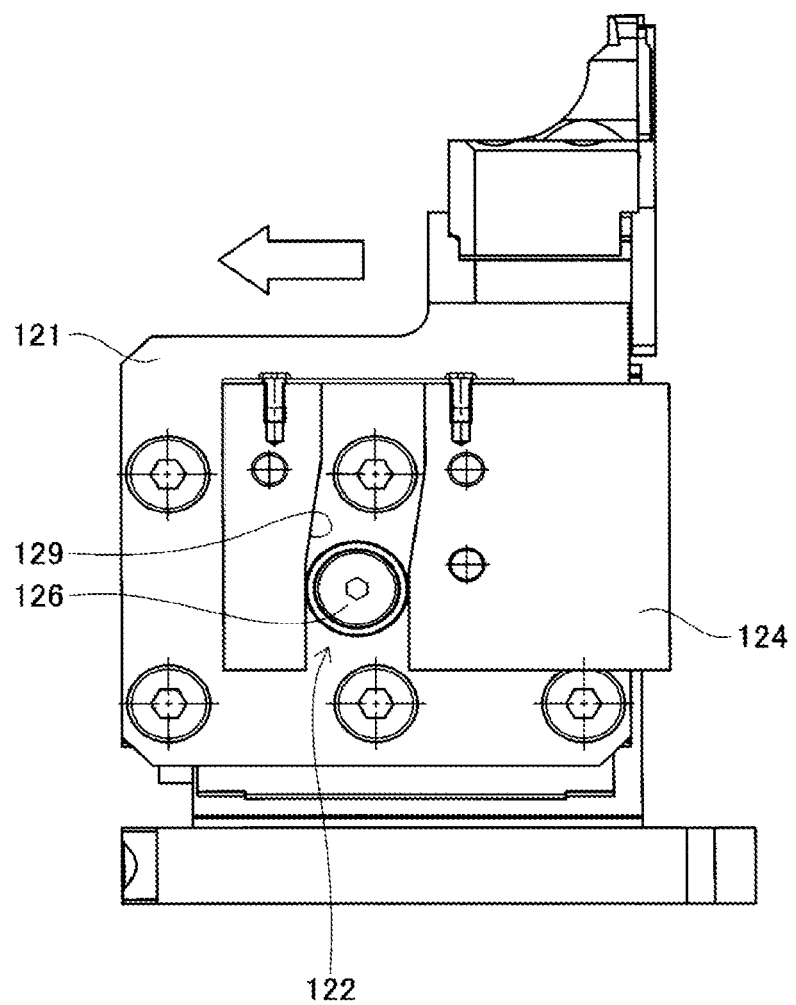
FIG. 8 illustrates operation of a moving section.

Also, roller 126 is arranged on the rear side of movable section 121 so as to face slide block 124. Cam groove 129 is formed in slide block 124 that faces roller 126 extending in the vertical direction, and roller 126 fits into cam groove 129. Note that, as shown in FIG. 7, cam groove 129 is bent slightly to the left moving from up to down. Thus, by slide block 124 being raised in accordance with the driving of cylinder 125, roller 126 engaged in cam groove 129, as shown in fig. 8, moves to the left due to the bend to the left of cam groove 129. That is, roller 126 acts as a cam follower, and movable section 121 slides with respect to fixed section 120 in accordance with the movement of roller 126. According to such a configuration, slide device 122 slides movable section 121 with respect to fixed section 120.

Also, as shown in FIG. 6, the upper end section of fixed body section 120 is formed tapered towards the end, and first insertion hole 130 is formed so as to pierce the upper end section in a vertical direction. The upper end of first insertion hole 130 opens at the upper end surface of fixed section 120, and the edge that opens to the upper end surface is formed as fixed blade (refer to FIG. 12) 131. Also, the lower end of first insertion hole 130 opens to a side surface of fixed section 120, and discard box 132 is provided below the opening to the side surface.

Figure 9:
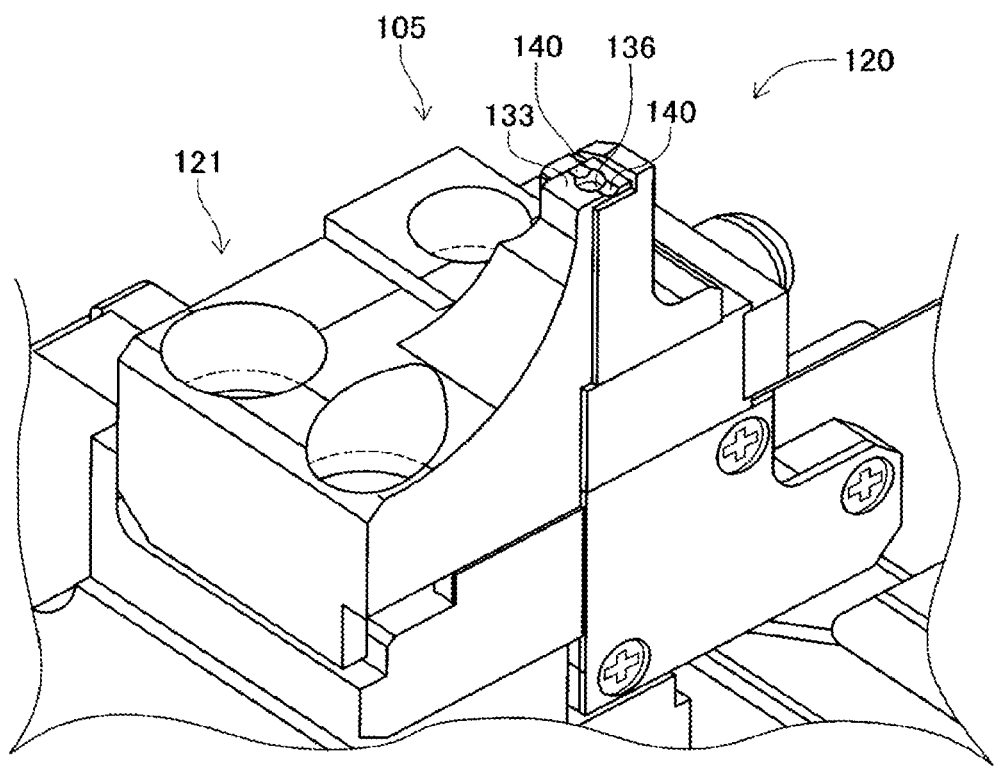
FIG. 9 is an enlarged view of the slide body.

Further, as shown in FIG. 9, an upper end section of movable section 121 is also formed tapered towards the end, and L-shaped curved section 133 is formed at the upper end section of movable section 121. Curved section 133 extends upwards of the upper end surface of fixed section 120, and there is slight clearance between curved section 133 and the upper end of main body section 120. And, first insertion hole 130 that opens at the upper end surface of fixed section 120 is covered by curved section 133, and second insertion hole 136 is formed in curved section 133 so as to face first insertion hole 130.

Second insertion hole 136 pierces through curved section 133 in a vertical direction, and an internal surface of second insertion hole 136 is a tapered surface configured with a diameter that gets smaller going down. On the other hand, the internal surface of first insertion hole 130 approaching the opening to the upper end surface of fixed section 120 is not a tapered surface, the internal surface of insertion hole 130 approaching the opening has an approximately regular diameter. Also, the edge of second insertion hole 136 that opens to the lower end surface of curved section 133 is formed as movable blade 138 (refer to FIG. 12).

Note that, guide groove 140 is formed in the upper end surface of curved section 133 extending in the sliding direction of movable section 121. Guide groove 140 is formed to straddle the opening of second insertion hole 136, and guide groove 140 and second insertion hole 136 are linked. Further, guide groove 140 is open at both side surfaces of curved section 133.

Figure 10:
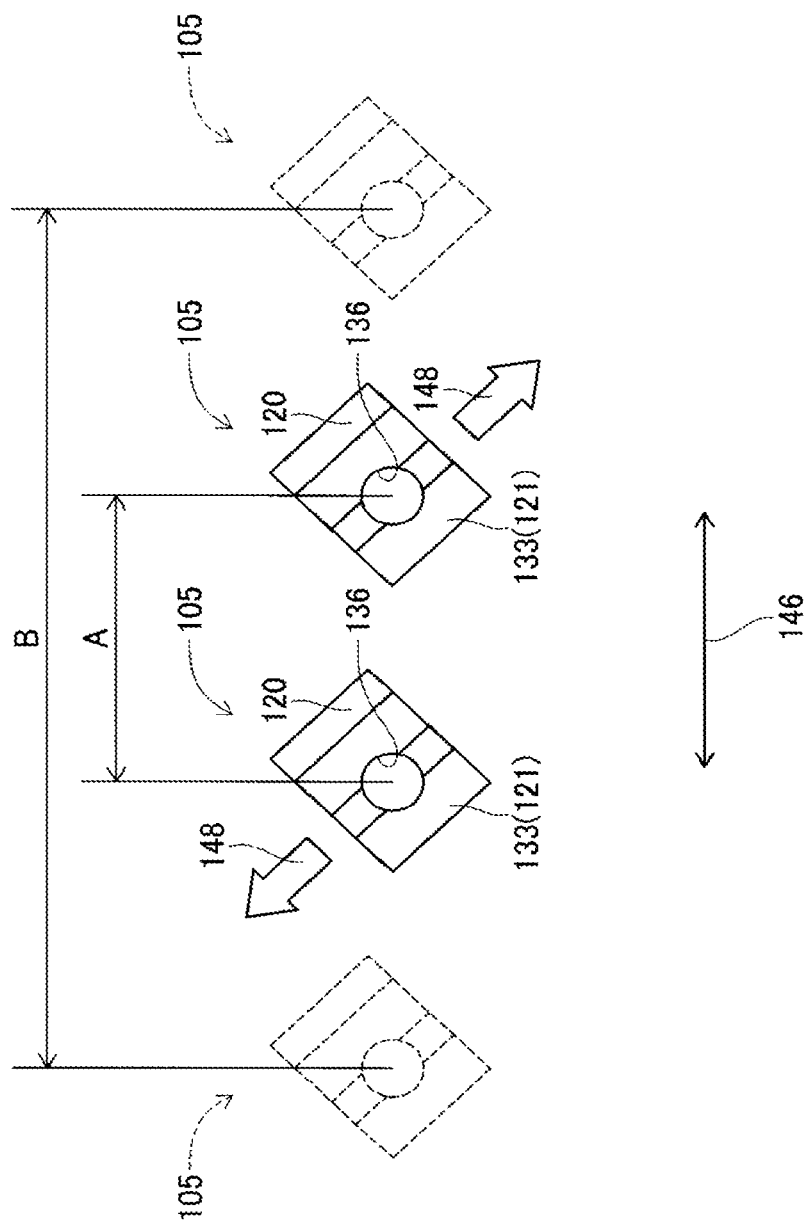
FIG. 10 is a plan view of the pair of slide bodies from above.

Also, as shown in FIG. 10, the pair of slide bodies 105 is arranged on the top of the pair of stages 107 such that the second insertion holes 136 of movable sections 121 of the pair of slide bodies 105 are lined up in the direction in which slide rail 106 extends (the direction in which arrow 146 extends). Further, the distance between the pair of second insertion holes 136 can be changed to any distance by operation of pitch changing mechanism 103. In detail, the pair of stages 107 are slid towards or away from each other along slide rail 106 by pitch changing mechanism 103. Thus, the pair of slide bodies 105 arranged on the pair of stages 107 move towards or away from each other along slide rail 106 in accordance with the sliding of the pair of stages 107. By this, the distance between the pair of slide bodies 105, that is, the distance between the pair of second insertion holes 136, is changed. Specifically, for example, in a case in which the pair of stages 107 are slid away from each other by operation of pitch changing mechanism 103, as shown by the dotted line in the figure, the pair of slide bodies 105 also slide away from each other, and the distance between the pair of second insertion holes 136 becomes longer. Note that, each slide body 105, as described above, is arranged on an upper surface of stage 107 in a state rotated substantially 45 degrees in the XY plane with respect to the direction in which slide rail 106 extends. Thus, movable section 121 of each slide body 105 slides in a direction rotated substantially 45 degrees in the XY plane with respect to the direction in which slide rail 106 extends. That is, the angle between the sliding direction of movable section 121 (the direction in which arrow 148 extends) and the direction in which slide rail 106 extends (the direction in which arrow 146 extends) is substantially 45 degrees.

Also, as shown in FIG. 3, unit moving device 102 includes X-direction moving device 150, Y-direction moving device 152, Z-direction moving device 154, and rotation device 156. X-direction moving device 150 includes slide rail 160 and X slider 162. Slide rail 160 extends in the X direction, and X slider 162 is slidably supported on X slide rail 160. Also, X slider 162 moves in the X direction by the driving of electromagnetic motor (refer to FIG. 11) 164. Y-direction moving device 152 includes slide rail 166 and Y slider 168. Slide rail 166 is arranged on X slider 162 extending in the Y direction, and Y slider 168 is slidably supported on slide rail 166. Also, Y slider 168 moves in the Y direction by the driving of electromagnetic motor (refer to FIG. 11) 170. Z-direction moving device 154 includes slide rail 172 and Z slider 174. Slide rail 172 is arranged on Y slider 168 extending in the Z direction, and Z slider 174 is slidably supported on slide rail 172. Also, Z slider 174 moves in the Z direction by the driving of electromagnetic motor (refer to FIG. 11) 176.

Further, rotation device 156 includes rotating table 178 that is roughly disc-shaped. Rotating table 178 is supported by Z slider 174 so as to be rotatable around its own center, and is rotated by the driving of electromagnetic motor (refer to FIG. 11) 180. Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotation device 156. Thus, second insertion hole 136 of cut and clinch unit 100 can be positioned at any position under circuit board 12 held by clamp device 52.

Figure 11:
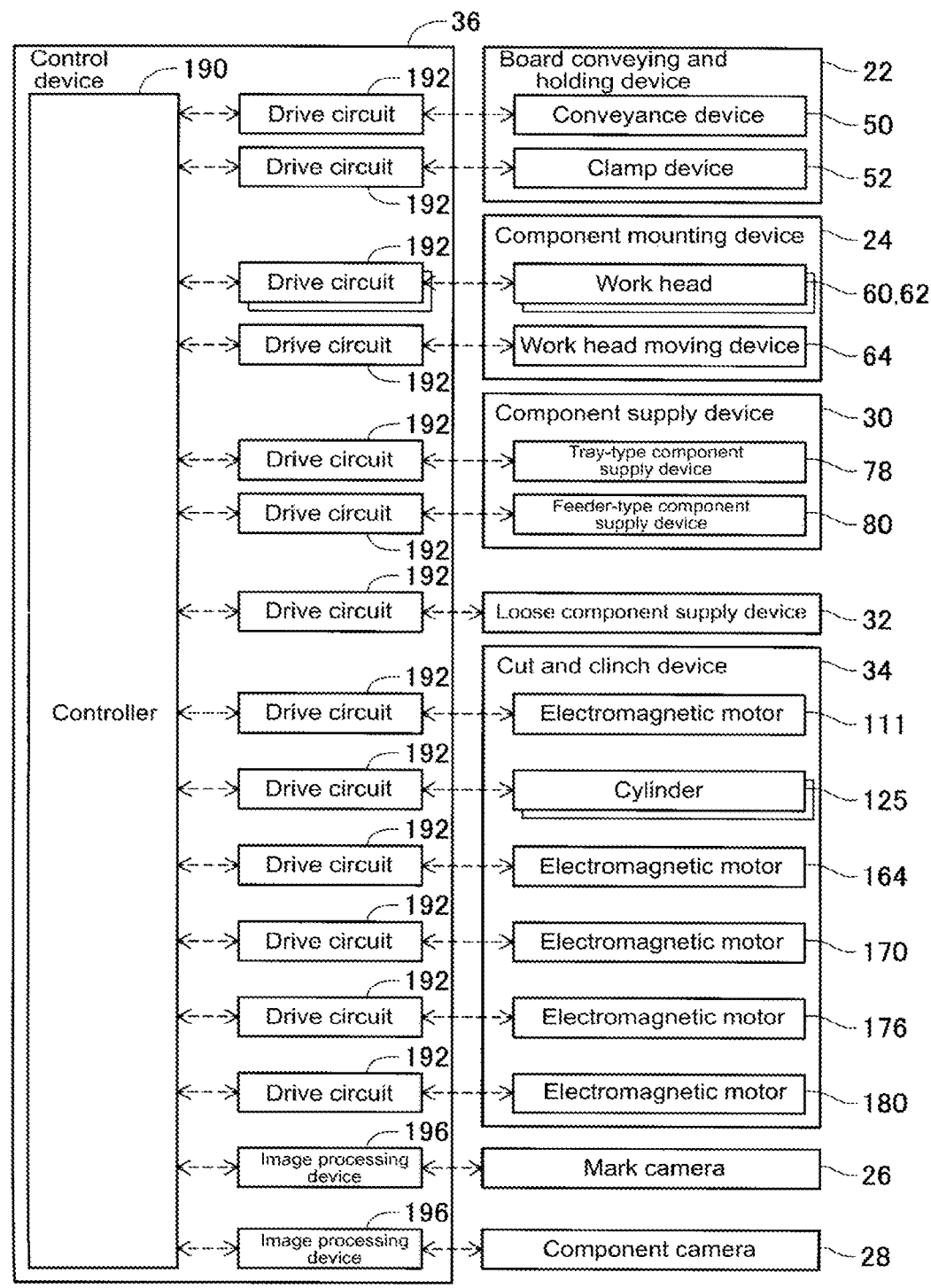
FIG. 11 is a block diagram showing a control device.

As shown in FIG. 11, control device 36 is provided with controller 190, multiple drive circuits 192, and image processing device 196. The multiple drive circuits 192 are connected to conveyance device 50, clamp device 52, work heads 60 and 62, work head moving device 64, tray type component supply device 78, feeder type component supply device 80, loose component supply device 32, electromagnetic motors 111, 164, 170, 176, and 180, and cylinder 125. Controller 190 is provided with a CPU, ROM, RAM, and so on, is formed mainly from a computer, and is connected to the multiple drive circuits 192. By this, operation of board conveying and holding device 22, component mounting device 24, and so on is controlled by controller 190. Controller 190 is also connected to image processing device 196. Image processing device 196 is for processing image data acquired by mark camera 26 and component camera 28, and controller 190 acquires various information from the image data.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which components with leads (hereinafter also referred to as "leaded component") are mounted on circuit board 12.

Figure 12:
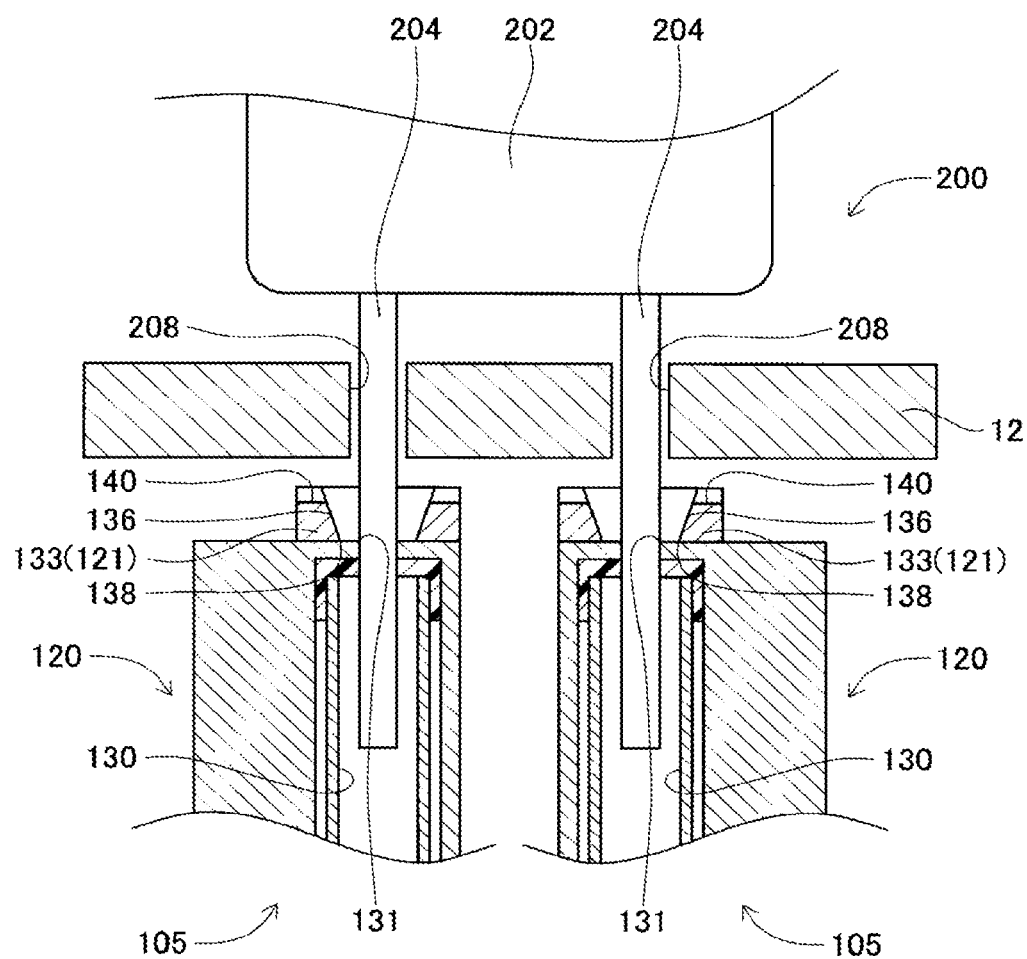
FIG. 12 is a cross section showing the cut and clinch unit before leads of a leaded component are cut.

Specifically, circuit board 12 is conveyed to a work position, and is fixedly held at that position by clamp device 52. Next, mark camera 26 moves above circuit board 12 and images circuit board 12. By this, information related to a holding position of circuit board 12 is obtained. Also, component supply device 30 or loose component supply device 32 supplies components at a specified supply position. One of the work heads 60 or 62 moves above the component supply position and holds a component using suction nozzle 66. Note that, as shown in FIG. 12, leaded component 200 is configured from component main body section 202, and two leads 204 protruding from the bottom surface of component main body section 202. Leaded component 200 is picked up and held by a suction nozzle 66 on component main body section 202.

Continuing, work head 60 or 62 holding leaded component 200 is moved above component camera 28, and leaded component 200 held by suction nozzle 66 is imaged by component camera 28. Accordingly, information related to the holding position of the component is obtained. Continuing, work head 60 or 62 holding leaded component 200 moves above circuit board 12, and corrects the error in the holding position of circuit board 12 and the error in the holding position of the component and so on. Then, the two leads 204 of leaded component 200 held by suction nozzle 66 are inserted into two through-holes 208 formed in circuit board 12. Here, cut and clinch unit 100 is moved below circuit board 12.

Specifically, with cut and clinch unit 100, the distance between the second insertion holes 136 of movable section 121 of the pair of slide bodies 105 (hereinafter also referred to as "insertion hole separation distance") is adjusted by pitch changing mechanism 103 to be the same as the distance between the two through-holes 208 formed in circuit board 12. Further, by operation of rotating device 156, cut and clinch unit 100 is rotated such that the direction in which the two through-holes 208 are lined up matches the direction in which the pair of second insertion holes 136 are lined up. Also, cut and clinch unit 100 is moved by operation of X-direction moving device 150 and Y-direction moving device 152 such that the coordinates in the XY directions of the second insertion holes 136 of slide bodies 105 are aligned with the coordinates in the XY directions of the through-holes 208 of circuit board 12. Further, cut and clinch unit 100 is raised by operation of Z-direction moving device 154 such that the upper surface of movable section 121 contacts the lower surface of circuit board 12 or is positioned slightly below the lower surface of circuit board 12. Accordingly, cut and clinch unit 100 is arranged below circuit board 12 with the second insertion holes 136 of slide bodies 105 aligned with through-holes 208 of circuit board 12.

Then, when leads 204 of leaded component 200 held by suction nozzle 66 are inserted into through-holes 208 of circuit board 12, as shown in FIG. 12, the end section of leads 204 is inserted into first insertion hole 130 of fixed section 120 through second insertion hole 136 of movable section 121 of cut and clinch unit 100. Note that, the insertion direction of lead 204 into through-hole 208 is the direction in which through-hole 208 is formed, so in a case in which through-hole 208 is formed perpendicular to circuit board 12, this is a direction perpendicular to circuit board 12, that is, the Z direction. Also, when lead 204 is inserted into through-hole 208, because the inner circumferential surface of second insertion hole 136 positioned below through-hole 208 is tapered, it is possible to ensure that the tip section of lead 204 appropriately enters the first insertion hole 130.

Figure 13:
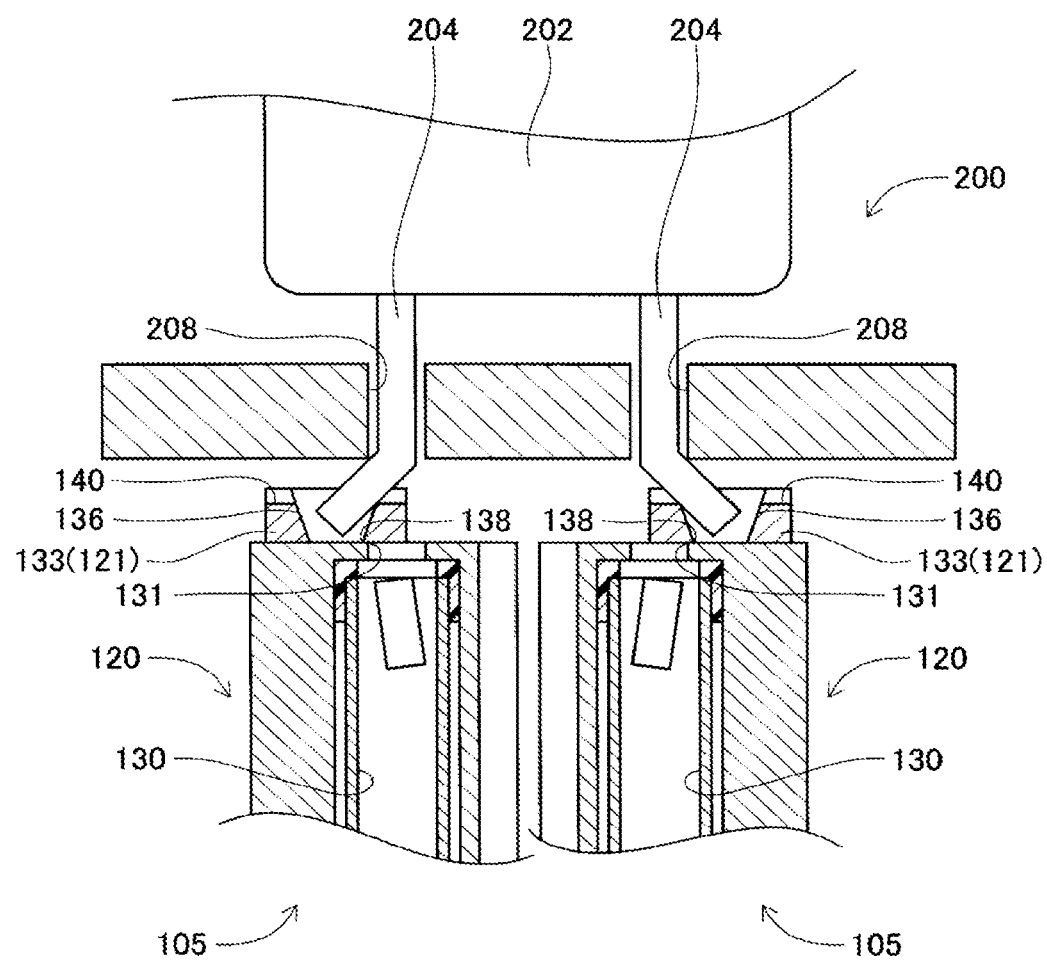
FIG. 13 is a cross section view of a cut and clinch unit after leads of a leaded component have been cut.

Next, when the tip section of lead 204 has been inserted into first insertion hole 130 via second insertion hole 136, movable sections 121 are each slid by operation of their respective slide device 122. Thus, as shown in FIG. 13, lead 204 is cut by fixed blade 131 of first insertion hole 130 and movable blade 138 of second insertion hole 136. Then, the tip section separated by the cutting of lead 204 falls through first insertion hole 130 and is discarded in discard box 132.

Also, the pair of movable sections 121, after cutting leads 204, are slid further. Therefore, the new tip section formed by the cutting of lead 204 is bent along the tapered surface of the inside of second insertion hole 136 in accordance with the sliding of movable section 121, and the tip section of lead 204 is bent along guide groove 140 by the further sliding of movable section 121. Here, the pair of leads 204 are bent away from each other in directions different to the direction in which the pair of leads 204 are lined up.

Figure 14:
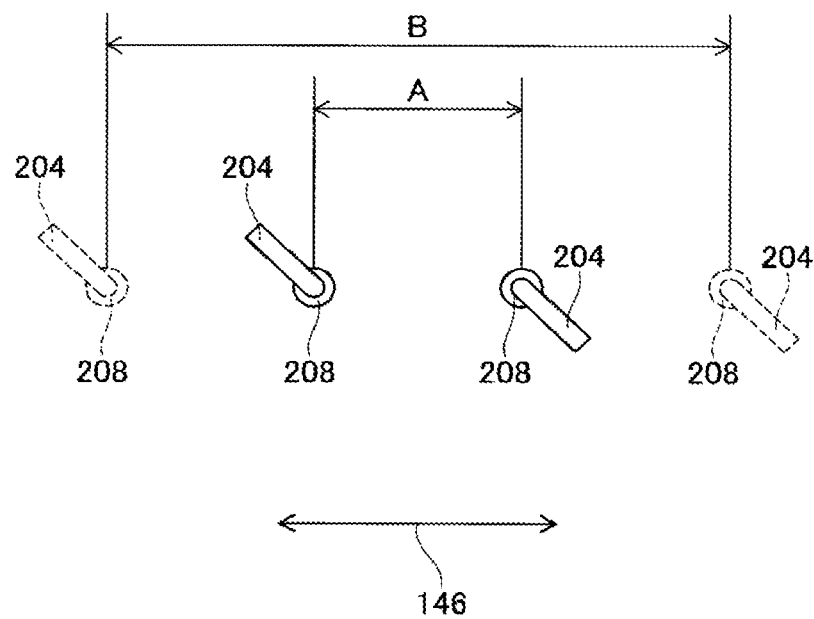
FIG. 14 is a schematic view showing leads bent into an N-shape.

In detail, as shown in FIG. 10, second insertion holes 136 of the pair of slide bodies 105 are arranged along the direction in which arrow 146 extends. On the other hand, the sliding direction of movable sections 121 (the direction in which arrow 148 extends) is 45 degrees in the XY plane with respect to the direction in which the second insertion holes 136 are lined up. That is, movable sections 121 slide in a direction 45 degrees in the XY plane with respect to the direction in which the pair of leads 204 inserted into the pair of second insertion holes 136 are lined up. Thus, as shown in FIG. 14, the pair of leads 204 are bent in a direction 45 degrees in the XY plane with respect to the direction in which the pair of through-holes 208 are lined up (the direction in which arrow 146 extends). By this, leaded component 200 is mounted on circuit board 12 with the pair of leads 204 bent in substantially an N shape (hereinafter also referred to as "N-bent state"), so as to prevent leads 204 coming out of through-holes 208. Also, by mounting leaded component 200 in circuit board 12 in an N-bent state, leaded component 200 is held securely without any play due to tension being generated in a direction different to the direction in which the leads 204 are lined up.

In this manner, with component mounter 10, cut and clinch unit 100 capable of bending a pair of leads 204 in an N-bent state can be moved to any position in the XY direction below circuit board 12 by operation of X-direction moving device 150 and Y-direction moving device 152. That is, cut and clinch unit 100 can be moved is a direction perpendicular to the insertion direction of leads 204 into through-holes 208. Accordingly, a lead 204 inserted into any through-hole 208 of circuit board 12 can be cut and bent by cut and clinch unit 100. That is, leads 204 can be mounted in an N-bent state at any position on circuit board 12.

Also, with cut and clinch unit 100, the insertion hole separation distance can be changed by operation of pitch changing mechanism 103. Thus, even if there are leaded components for which the distance between the pair of leads varies, by changing the insertion hole separation distance, it is possible to bend the pair of leads 204 in an N-bent state. Accordingly, many types of leaded components can be bent into an N-bent state using cut and clinch unit 100.

Note that, with the pair of slide bodies 105 that are moved when the insertion hole separation distance is changed, slide device 122 for sliding movable section 121 is provided on each slide body 105. That is, a slide device 122 that slides movable section 121 is provided for each slide body 105. Conversely, for example, in a case in which only one slide device is provided for a pair of slide bodies 105, a transmission mechanism is required from the single slide device to the pair of movable sections 121. Also, when the insertion hole separation distance is changed, that is, the pair of slide bodies are moved towards or away from each other, that transmission mechanism would need to transmit force from the single slide device to the pair of movable sections 121, meaning that the configuration of the transmission mechanism would be extremely complex. Therefore, with cut and clinch unit 100, a slide device 122 is provided for each slide body 105, and slide devices 122 have a relatively simple configuration.

Furthermore, as shown in FIG. 10, the direction in which the pair of second insertion holes 136 are lined up is aligned with the direction in which slide rail 106 extends (the direction in which arrow 146 extends). That is, the direction in which the pair of second insertion holes 136 are lined up is aligned with the sliding direction of slide bodies 105. Therefore, even if the insertion hole separation distance is changed, it is possible to keep the bending direction of leads 204 the same. Specifically, for example, in a case in which the distance between the pair of leads (hereinafter also referred to as "lead separation distance") is A, the pair of slide bodies 105 move to the positions shown by the solid lines in the figure. On the other hand, if the lead separation distance is B (>A), the pair of slide bodies 105 move to the positions shown by the dotted lines in the figure. Then, as shown in FIG. 14, the pair of leads 204 with a lead separation distance of A are bent as shown by the solid lines, and the pair of leads 204 with a lead separation distance of B are bent as shown by the dotted lines. As illustrated in the figure, the bending direction of the leads 204 with a lead separation distance of A and the bending direction of the leads 204 with a lead separation distance of B are the same. This is because the relative angle between the direction in which the pair of second insertion holes 136 are lined up and the sliding direction of movable sections 121 does not change even if the insertion hole separation distance changes. Accordingly, even if the insertion hole separation distance is changed, it is possible to keep the bending direction of leads 204 the same, thereby achieving stable mounting quality of leads 204.

Note that, cut and clinch device 34 is an example of a bending device. Cut and clinch unit 100 is an example of a bending unit. Unit moving device 102 is an example of a moving device. Pitch changing mechanism 103 is an example of a changing mechanism. Slide body 105 is an example of a bending body. Fixed section 120 is example of a holding section. Movable section 121 is an example of a slide section. One of the cylinders 125 of the pair of slide devices 122 is an example of a first drive source, and the other is example of a second drive source. Second insertion hole 136 is an example of an insertion hole.

Further, the present disclosure is not limited to the above example embodiments, and various changed or improved methods of embodiment are possible based on the knowledge of someone skilled in the art. Specifically, for example, in an embodiment above, cut and clinch unit 100 is movable in directions (X direction and Y direction) perpendicular to the insertion direction (Z direction) of leads 204 into insertion holes 208, but may be movable in a rotational direction with respect to the insertion direction (Z direction) of leads 204 into insertion holes 208. In other words, cut and clinch unit 100 may be configured to be movable in a direction shifted by a given angle from the horizontal direction (XY plane) that is perpendicular to the insertion direction (Z direction) of leads 204 into insertion holes 208.

Figure 15:
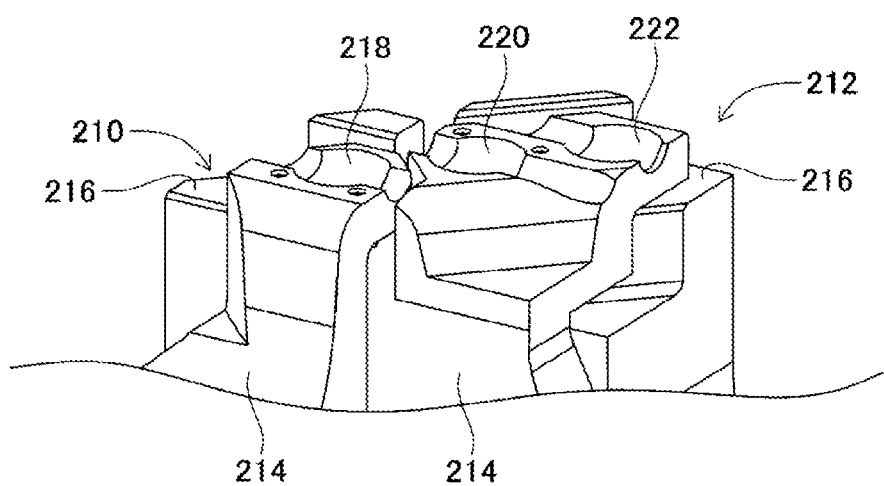
FIG. 15 is an enlarged view of an alternative slide body.

Also, in an embodiment above, a cut and clinch device 34 corresponding to pair of leads 204 is used, but a device corresponding to three or more leads may be used. Specifically, for example, instead of the pair of slide bodies 105 of an embodiment above, a pair of slide bodies 210 and 212 as shown in FIG. 15 may be used. Similar to slides bodies 105 of an embodiment above, each slide body 210 and 212 includes fixed section 214 and movable section 216. Also, one insertion hole 218 is formed in fixed section 214 of slide body 210, but two insertion holes, 220 and 222, are formed in fixed section 214 of slide body 212. Note that, the three insertion holes 218, 220, and 222 are arranged in a straight line. By using the pair of slide bodies 210 and 212 configured in this manner, it is possible to mount a component with three leads on circuit board 12 in an N-bent state. That is, so long as the "bending unit" of the present disclosure is capable of bending at least one pair of leads into an N-bent state, it may be capable of bending three, four, five or greater leads into an N-bent state.

Further, in an embodiment above, leads 204 are bent in a direction at 45 degrees to the direction in which leads 204 are lined up, but so long as the direction is different to the direction in which leads 204 are lined up, leads 204 may be bent in various directions at an angle with respect to the direction in which leads 204 are lined up.

Also, in an embodiment above, the disclosure is applied to cut and clinch device 34 that cuts and bends leads 204, but the disclosure may be applied to a lead bending device that bends leads 204 without cutting them.

Further, in an embodiment above, a cam mechanism is used as slide device 122 that slides movable section 121, but various transmission mechanisms may be used such as a link mechanism or a gear mechanism.

REFERENCE SIGNS LIST

34: cut and clinch device (bending device); 100: cut and clinch unit (bending unit); 102: unit moving device (moving device); 103: pitch changing mechanism (changing mechanism); 105: slide body (bending body); 120: fixed section (holding section); 121: movable section (slide section); 125: cylinder (first drive source) (second drive source); 136: second insertion hole (insertion hole)

The invention claimed is:

1. A bending device comprising:
   a bending unit including
      a pair of bending bodies each including an insertion hole configured to have a lead of a leaded component inserted therein,
      a movable section configured to move each of the pair of bending bodies in a direction perpendicular to an insertion direction of the leads into the insertion holes, the movable section including a first sliding mechanism,
      a fixed body on which the movable section slides relatively, the bending unit being configured to bend a pair of leads extending in a plane and inserted into the insertion holes of the pair of bending bodies, and
      a changing mechanism configured to change a distance that separates the insertion holes of the pair of bending bodies, the changing mechanism including a second sliding mechanism,
   wherein an angle between a first direction in which the first sliding mechanism slides and a second direction in which the second sliding mechanism slides is acute.

2. The bending device according to claim 1, wherein the movable section includes a first cylinder configured to slide one of the pair of bending bodies, and a second cylinder configured to drive the other of the pair of bending bodies.

3. The bending device according to claim 1, wherein the changing mechanism changes the distance separating the pair of bending bodies by moving the pair of bending bodies towards and away from each other in a direction in which the insertion holes of the bending bodies of the pair of bending bodies are lined up.

4. The bending device according to claim 1, further comprising:
   a moving device on which the bending unit is mounted, the moving device configured to move the bending unit along three axes.

* * * * *